United States Patent [19]

Yamamoto

[11] Patent Number: 4,959,839
[45] Date of Patent: Sep. 25, 1990

[54] RIB WAVEGUIDE TYPE SEMICONDUCTOR LASER

[75] Inventor: Motoyuki Yamamoto, Kawasaki, Japan

[73] Assignee: Kabushiki Kaisha Toshiba, Kawasaki, Japan

[21] Appl. No.: 383,530

[22] Filed: Jul. 24, 1989

[30] Foreign Application Priority Data

Jul. 25, 1988 [JP] Japan .................. 63-183495

[51] Int. Cl.⁵ .................................. H01S 3/19
[52] U.S. Cl. ........................ 372/46; 372/45; 357/16; 357/17
[58] Field of Search ............ 372/46, 45, 44, 43; 357/17, 16

[56] References Cited

U.S. PATENT DOCUMENTS 4,792,958 12/1988 Ohba et al. ................ 372/45
4,845,724 7/1989 Hayakawa et al. ......... 372/46

FOREIGN PATENT DOCUMENTS 0102286 8/1980 Japan ................ 372/46
0272988 12/1986 Japan ................ 372/46
0284985 12/1986 Japan ................ 372/45

Primary Examiner—William L. Sikes
Assistant Examiner—Georgia Y. Epps
Attorney, Agent, or Firm—Oblon, Spivak, McClelland, Maier & Neustadt

[57] ABSTRACT

A rib waveguide type semiconductor laser including p-type high impurity concentration layer formed between a p-upper cladding layer and p-ohmic layer and having an impurity concentration higher than the impurity concentration of the p-upper cladding layer and p-ohmic layer. The high impurity concentration layer acts to make small a discontinous portion of the valence band between the p-upper cladding layer and p-ohmic layer and change the steep junction to a smoothly inclined junction, thereby lowering the voltage drop across the junction.

11 Claims, 2 Drawing Sheets

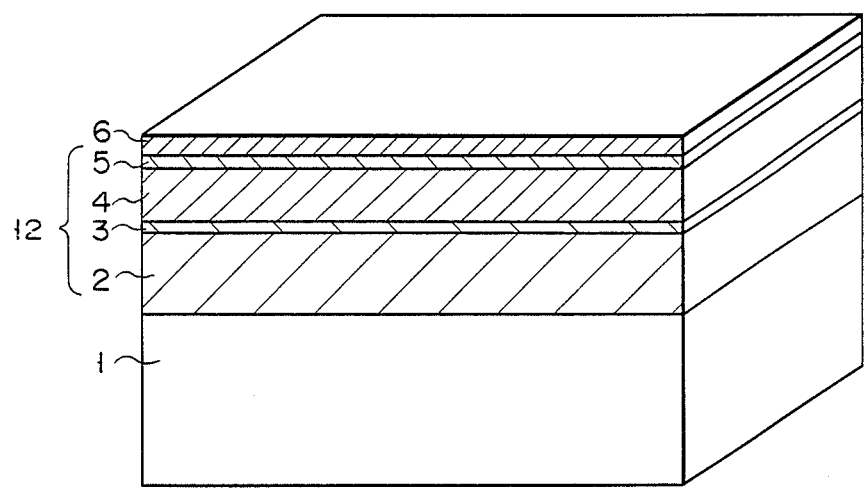
F I G. 1A
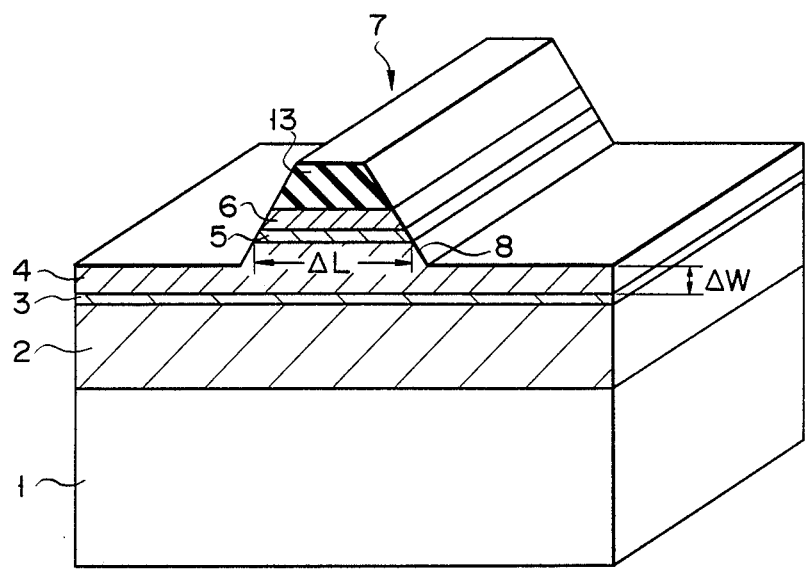
F I G. 1B

RIB WAVEGUIDE TYPE SEMICONDUCTOR LASER

BACKGROUND OF THE INVENTION

1. Field of the Invention

This invention relates to a semiconductor laser, and more particularly to a semiconductor laser with rib waveguide structure.

2. Description of the Related Art

Recently, a semiconductor laser has been widely used and a semiconductor laser with rib waveguide structure has been used in various application fields. The construction of the semiconductor laser with rib waveguide structure is disclosed in, for example, ELECTRONICS LETTERS Aug. 27th, 1987 Vol. 23 No. 18 P.938 and 939 "HIGH-POWER OPERATION OF A TRANSVERSE-MODE STABILIZED AlGaInP VISIBLE LIGHT ($\lambda_L$=683 nm) SEMICONDUCTOR LASER".

However, in the semiconductor laser shown in FIG. 1 of the above document, a heterojunction is formed between a p - $(Al_{0.6} Ga_{0.4})_{0.5} In_{0.5}P$ layer and a p-GaAs layer, that is, between an upper cladding layer and the bottom portion of an ohmic layer. Since a large voltage drop occurs across the heterojunction portion, the power consumption may become large and the heterojunction portion tends to generate heat, degrading the temperature characteristic of the semiconductor laser.

SUMMARY OF THE INVENTION

Accordingly, an object of this invention is to provide a rib waveguide type semiconductor laser of transverse mode control type in which a voltage drop between the upper cladding layer and the ohmic layer is reduced so as to lower the power consumption and suppress heat generation, thus enhancing the temperature characteristic.

The above object can be attained by a rib waveguide type semiconductor laser comprising a semiconductor substrate of a first conductivity type; a lower cladding layer of the first conductivity type formed on the semiconductor substrate; an active layer formed on the lower cladding layer; an upper cladding layer of a second conductivity type formed on the active layer and having a mesa portion formed in a stripe configuration to extend in a direction parallel to the main surface of the semiconductor substrate; an ohmic layer of the second conductivity type formed on the mesa portion of the upper cladding layer; a current inhibition layer of the first conductivity type formed on portion of the upper cladding layer other than the mesa portion; and a high impurity concentration layer of the second conductivity type formed between the upper cladding layer and the ohmic layer and having an impurity concentration higher than the impurity concentration of the upper cladding layer and the ohmic layer.

In the above semiconductor laser, since a layer having the same conductivity type as an impurity concentration higher than the upper cladding layer and the ohmic layer is formed between the upper cladding layer and the ohmic layer, the discontinuous portion of the valence band can be made small and a steep junction can be modified to a smoothly inclined junction, thereby reducing the voltage drop across the junction.

Therefore, a rib waveguide type semiconductor laser of transverse mode control type can be provided in which the voltage drop between the upper cladding layer and the ohmic layer can be reduced and heat generation can be suppressed, thereby enhancing the temperature characteristic.

BRIEF DESCRIPTION OF THE DRAWINGS

FIGS. 1A to 1C are views showing the construction of a rib waveguide type semiconductor laser according to a first embodiment of this invention in respective steps of a manufacturing process.

DETAILED DESCRIPTION OF THE PREFERRED EMBODIMENTS

Figure 1C:
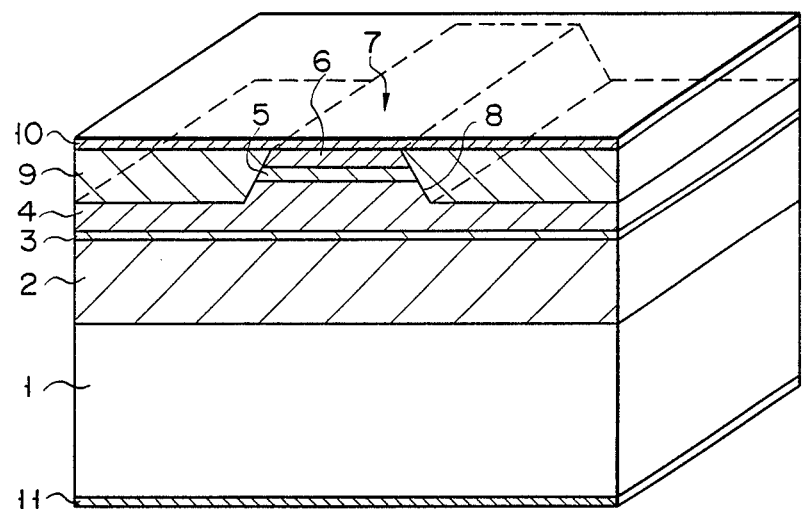

FIGS. 1A to 1C show the construction of a rib waveguide type semiconductor laser according to a first embodiment of this invention in respective steps of a manufacturing process. As shown in FIG. 1A, Group III-V crystal for lattice matching is deposited by the MOCVD method on the main surface of n-GaAs substrate 1 having Si doped therein at an impurity concentration of approx. $1 \times 10^{18} cm^{-3}$. The MOCVD method is effected under a condition that the pressure is 0.1 atm., the deposition temperature is 750° C., and the source materials were trimethylaluminum (TMA), trimethlindium (TMI), trimethylgallium (TMG) of the group III element, and arsine ($AsH_3$), phosphine ($pH_3$) of the group V element. The doping sources were dimethylzinic (DMZn) for p-type layers and silane ($SiH_4$) for n-type layers. The concentration of the materials is such that silane is 100 p.p.m., arsine is 10 Vol % and phosphine is 20 Vol %.

Under this condition, lower cladding layer 2 of n-$In_{0.49} (Ga_{0.3} Al_{0.7})_{0.51}P$ (Si doped; $3 \times 10^{17} cm^{-3}$, thickness 1.5 $\mu$m), active layer 3 of $In_{0.49}Ga_{0.51}P$ (undoped; $1 \times 10^{17} cm^{-3}$, thickness 0.1 $\mu$m), upper cladding layer 4 of p-$In_{0.49} (Ga_{0.3} Al_{0.7})_{0.51}P$ (Zn doped; $3 \times 10^{17} cm^{-3}$, thickness 1.5 $\mu$m), high impurity concentration layer 5 of p-$In_{0.49} (Ga_{0.8} Al_{0.2})_{0.51}P$ (Zn doped; $5 \times 10^{18} cm^{-3}$, thickness 0.2 $\mu$m) and ohmic layer 6 of p-GaAs (Zn doped; $5 \times 10^{18} cm^{-3}$, thickness 0.5 $\mu$m) are sequentially deposited on the main surface of n-GaAs substrate 1 to form multi-layered film 12.

In order to form lower cladding layer 2 which is the first layer of multi-layered film 12, trimethylgallium, trimethylaluminum, trimethylindium, phosphine and silane among the above-described materials are selectively used. In order to form active layer 3 which is the second layer, trimethylgallium, trimethlindium and phosphine are used. In order to form upper cladding layer 4 which is the third layer, trimethylgallium, trimethylaluminum, trimethylindium, phosphine and dimethylzinc are used. Like the third layer, in order to form high impurity concentration layer 5 which is the fourth layer, trimethylgallium, trimethylaluminum, trimethylindium, phosphine and dimethylzinc are used. Further, in order to form ohmic layer 6 which is the fifth layer, trimethylgallium, dimethylzinc and arsine are used.

After this, $SiO_2$ film 13 is deposited to a thickness of 1000 Å on ohmic layer 6 by the CVD method and then layer 13 is patterned by a well-known photolithographic method. Subsequently, ohmic layer 6, high impurity concentration layer 5 and upper cladding layer 4 are selectively etched with $SiO_2$ film 13 used as a mask. As the result of the etching process, as shown in FIG. 1B, both sides of ohmic layer 6 and high impurity concentration layer 5 are removed and the central portions thereof are left in the stripe form and the central portion of the surface region of upper cladding layer 4 is left in the stripe form. Width "$\Delta L$" of mesa portion 7 remaining in the stripe form on the surface of upper cladding layer 4 is approx. 3 μm. As an etching solution used in the etching process, a sulfuric acid series solution is used for ohmic layer (p-GaAs) 6 and an oxalic acid series solution is used for high impurity concentration layer 5 and upper cladding layer 4. The etching process is controlled so that the thickness of portion other than mesa portion 7 of upper cladding layer 4, that is, thickness "$\Delta W$" between the etched surface of upper cladding layer 4 and active layer 3 can be set at 0.2 μm.

As described above, mesa portion 7 is formed in the stripe configuration on substantially the central portion of upper cladding layer 4 so as to extend in a direction (parallel to the main surface of substrate 1) perpendicular to the laminated direction of multilayered film 12, and acts as a passive rib waveguide.

Next, the MOCVD method is effected again to form current inhibiting layer (Si doped; $2 \times 10^{18}$ cm$^{-3}$, thickness 1.5 μm) 9 so as to cover mesa type high impurity concentration layer 5 and ohmic layer 6 and side surface 8 of mesa portion 7 with the width of 3 μm acting as the passive rib waveguide. After this, SiO$_2$ film 13 remaining on ohmic layer 6 is removed by use of hydrofluoric acid series etching solution and electrodes are formed on respective exposed surfaces.

That is, Ti/Pt/Au alloy layer 10 and AuGe/Ni/Au alloy layer 11 are respectively formed as p-side and n-side electrodes on the exposed surface of ohmic layer 6 and the exposed surface (rear surface) of n-GaAs substrate 1 by the vapor deposition method or sputtering method, thus forming the rib waveguide type semiconductor laser as shown in FIG. 1C.

When the layers necessary for the rib waveguide type semiconductor laser are formed by the MOCVD method, a close relation is set up between the growth temperature and the oscillation wavelength of the laser. When the growth temperature is set below 600° C. or above 750° C., the laser oscillates at 1.9 eV near the forbidden band width of InGaP which is formed in lattice junction with GaAs. It is also known that it oscillates below 1.9 eV when the growth temperature is set in a range between 600° C. and 750° C.

Further, the quality of crystal grown at temperatures higher than 750° C. is extremely superior to that of crystal grown at other temperatures. Therefore, it is a common practice to grow crystal at temperatures higher than 750° C. However, the amount of zinc as a p-type impurity which can be introduced into the crystal becomes smaller as the growth temperature becomes lower and the pressure at the growth becomes lower, and an amount of only approx. $3 \times 10^{17}$ cm$^{-3}$ of zinc can be introduced into p-upper cladding layer 4.

In the heterojunction between p-upper cladding layer 4 and p-ohmic layer 6, the width of the discontinuous portion of the valence band can be expressed by "$\Delta Ev = Eg_1 - Eg_2 - \Delta Ec$". In this case, $Eg_1$ denotes the forbidden band width of p-upper cladding layer 4, $Eg_2$ denotes the forbidden band width of p-ohmic layer 6 and $\Delta Ec$ denotes the width of the discontinuous portion of the conduction band of each layer.

Current will not flow until a voltage exceeding the discontinuous portion is applied between p-upper cladding layer 4 and p-ohmic layer 6.

In order to make small the width of the discontinuous portion of the valence band, it is important to reduce the forbidden band width of the heterojunction and the voltage drop can be suppressed by reducing the spike width of $\Delta Ev$.

In this invention, the width of the discontinuous portion of the valence band is reduced by forming layer 5 having an impurity concentration higher than p-upper cladding layer 4 and p-ohmic layer 6 between p-upper cladding layer 4 and p-ohmic layer 6. Also, the voltage drop is reduced by changing the steep junction or stepped junction to a smoothly inclined junction.

When the rib waveguide type semiconductor laser of the above construction is energized, current is not supplied to current inhibition layer 9 but only to p-ohmic layer 6. Further, since light emitted is absorbed into current inhibition layer at portions other than the rib waveguide, a transverse mode controlled laser oscillation can be attained.

As described above, in this invention, a voltage drop between p-cladding layer 4 and p-ohmic layer 6 is reduced by lowering the potential difference in the valence band of the heterojunction between p-cladding layer 4 and p-ohmic layer 6. The discontinuous portion in the valence band can be made small and the step junction can be changed to a smoothly inclined junction by forming p-type high impurity concentration layer 5 between layers 4 and 6 so as to reduce the voltage drop across the junction. It is necessary to set the forbidden band width of high impurity concentration layer 5 equal to or between those of upper cladding layer 4 and ohmic layer 6.

In general, in order to attain the inclined junction and satisfy the condition on the forbidden band width of high impurity concentration layer 5, it is preferable to form upper cladding layer 4 and lower cladding layer 2 expressed by $\text{In}_{1-x}(\text{Ga}_{1-y}\text{Al}_y)_x$ P, active layer 3 expressed by $\text{In}_{1-x}(\text{Ga}_{1-z}\text{Al}_z)_x$ P and high impurity concentration layer 5 expressed by $\text{In}_{1-x}(\text{Ga}_{1-r}\text{Al}_r)_x$ P and satisfy that $y \geq z$ and $r$ and $1 \geq y > 0$.

Figure 2:
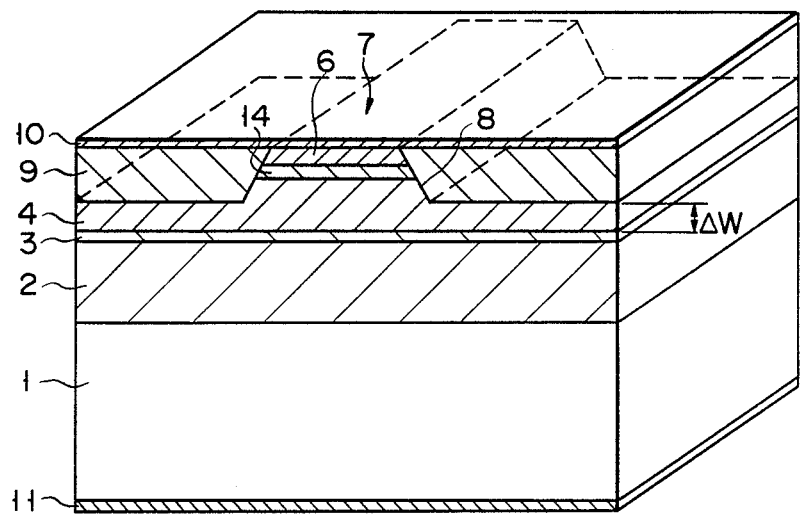
FIG. 2 is a view showing the construction of a rib waveguide type semiconductor laser according to a second embodiment of this invention.

FIG. 2 shows a rib waveguide type semiconductor laser according to a second embodiment of this invention. The basic construction of this semiconductor laser is similar to that of the semiconductor laser shown in FIG. 1C except the material of the high impurity concentration layer. That is, in this embodiment, $\text{Ga}_{1-s}\text{Al}_s$ As layer 14 is used as the high impurity concentration layer instead of p-$\text{In}_{0.49}$ ($\text{Ga}_{0.8}$ $\text{Al}_{0.2}$)$_{0.51}$P layer 5.

In order to form $\text{Ga}_{1-s}\text{Al}_s$ As layer 14, upper cladding layer 4 of p-$\text{In}_{0.49}$ ($\text{Ga}_{0.3}$ $\text{Al}_{0.7}$)$_{0.51}$P (Zn doped; $3 \times 10^{17}$ cm$^{-3}$, thickness 1.5 μm) is first formed by the MOCVD method, and high impurity concentration layer 14 of p-$\text{Ga}_{0.6}$ $\text{Al}_{0.4}$ As (Zn doped; $1 \times 10^{19}$ cm$^{-3}$, thickness 0.2 μm) is formed in the same manner as described above. Then, ohmic layer 6 of p-GaAs (Zn doped; $1 \times 10^{18}$ cm$^{-3}$, thickness 0.5 μm) is formed by deposition on high impurity concentration layer 14.

Next, an SiO$_2$ layer (not shown) is formed to a thickness of 1000 Å on ohmic layer 6 by the CVD method and the SiO$_2$ layer is subjected to the photolithographic process so that only a portion of 3 μm width may be left and other portions can be removed. Then, ohmic layer 6, high impurity concentration layer 14 and upper cladding layer 4 are etched with the SiO$_2$ layer used as a mask. As a result, mesa portion 7 formed in a stripe configuration to extend in a direction parallel to the main surface of substrate 1 can be obtained as described above.

As an etching solution used in the etching process, a sulfuric acid series solution is used for p-GaAs ohmic layer 6 and high impurity concentration layer 14 of p-$Ga_{0.6}Al_{0.4}As$ and an oxalic acid series solution is used for upper cladding layer 4 of p-$In_{0.49}(Ga_{0.3}Al_{0.7})_{0.51}P$. In this case, the etching process is controlled so that the thickness AW of portion of upper cladding layer 4 other than mesa portion 7 can be set at 0.2 μm. The succeeding process is the same as described above.

In order to satisfy the condition that the forbidden band width of high impurity concentration layer 14 is set equal to or between those of upper cladding layer 4 and ohmic layer 6, it is necessary to satisfy that layer 14 is expressed by $Ga_{(1-s)}Al_{(s)}As$ and $0.8 \geq s \geq 0$.

$Ga_{(1-s)}Al_{(s)}As$ is used as high impurity concentration layer 14 for the following reason. First, $Ga_{(1-s)}Al_{(s)}As$ can be formed with carrier concentration higher than the p-In(GaAl)P crystal. Secondly, The carrier concentration can be easily controlled. Thirdly, the diffusion coefficient of Zn in $Ga_{(1-s)}Al_{(s)}As$ is smaller than that in p-In(GaAl)P so that abnormal diffusion of impurity into p-cladding layer 4 can be suppressed. Fourthly, since p-ohmic layer 6 and high impurity concentration layer 14 can be processed by the same etching solution, the stripe width can be easily controlled, making it suitable for mass production.

Further, it is possible to use $In_{1-x}(Ga_{1-m}Al_m)_x(P_{1-n}As_n)$ as high impurity concentration layer 14 wherein $0 \leq m \leq 1.0$ and $0 \leq n \leq 1.0$. For example, when crystal with the average composition of $In_{0.49}(Ga_{0.8}Al_{0.2})0.51(P_{0.95}As_{0.05})$ is used as high impurity concentration layer 14, the lattice mismatching between the GaAs crystal and $In_{0.49}(Ga_{0.3}Al_{0.7})_{0.51}P$ cladding layer 6 is 0.05%. However, when films each having a different composite of In(GaAl)(PAs) are laminated to form a distorted superlattice, the layer is lattice-matched with the GaAs crystal.

Therefore, like the GaAlAs crystal, the carrier impurity concentration of the above crystal can be set to be higher than $1 \times 10^{19}$ cm$^{-3}$ and discontinuous portion ΔEv of the valence band thereof can be made smaller than that of the GaAlAs crystal, thereby further lowering the voltage drop between ohmic layer 6 and upper cladding layer 4 by more than 0.1 V.

In the above embodiments, Zn is used as a p-type impurity, but another impurity such as Mg can be used.

According to this invention, layer 5 or 14 having the same conductivity type as and an impurity concentration higher than the upper cladding layer and the ohmic layer is formed in the boundary portion between the upper cladding layer and the ohmic layer. With this construction, the operation voltage thereof can be lowered to 2.3 V which is sufficiently low in comparison with the operation voltage of 3.0 V of the conventional laser having a resonator length of 300 μm and stripe width of 3 μm.

As a result, the power consumption can be reduced and heat generation can be suppressed so that the temperature characteristic thereof can be improved over the conventional laser and rise in the operation current can be controlled. Further, the upper limit temperature at which continuous oscillation can be affected can be raised to 100° C. which is sufficiently high in comparison with that of 50° C. in the conventional case. In this way, the characteristic of the laser can be significantly improved, making it possible to develop a transverse mode control type laser for 650 nm visible light.

What is claimed is:

1. In a rib waveguide type semiconductor laser, the improvement comprising:
    a compound semiconductor substrate of a first conductivity type;
    a lower cladding layer of the first conductivity type formed on said semiconductor substrate;
    an active layer formed on said lower cladding layer;
    an upper cladding layer of a second conductivity type formed on said active layer and having a mesa portion formed in a stripe configuration to extend in a direction parallel to the main surface of said semiconductor substrate;
    an ohmic layer of the second conductivity type formed on said mesa portion of said upper cladding layer;
    a current inhibition layer of the first conductivity type formed on portion of said upper cladding layer other than said mesa portion; and
    a high impurity concentration layer of the second conductivity type formed between said upper cladding layer and said ohmic layer and having an impurity concentration higher than the upper cladding layer and said ohmic layer.

2. A rib waveguide type semiconductor laser according to claim 1, wherein the forbidden band width of said high impurity concentration layer is equal to the forbidden band width of said upper cladding layer and said ohmic layer.

3. A rib waveguide type semiconductor laser according to claim 1, wherein the forbidden band width of said high impurity concentration layer is set between the forbidden band widths of said upper cladding layer and said ohmic layer.

4. A rib waveguide type semiconductor laser according to claim 1, wherein said upper cladding layer and lower cladding layer each include $In_{1-x}(Ga_{1-y}Al_y)_xP$, said active layer includes $In_{1-x}(Ga_{1-z}Al_z)_xP$ and said high impurity concentration layer includes $In_{1-x}(Ga_{1-r}Al_r)_xP$, where $y \geq z$ and r, and $1 \geq y > 0$.

5. A rib waveguide type semiconductor laser according to claim 1, wherein said upper cladding layer and lower cladding layer each include $In_{1-x}(Ga_{1-y}Al_y)_xP$ where $1 \geq y > 0$, said active layer includes $In_{1-x}(Ga_{1-z}Al_z)_xP$ where $y \geq z$ and said high impurity concentration layer includes $Ga_{(1-s)}Al_{(s)}As$ where $0.8 \geq s \geq 0$.

6. A rib waveguide type semiconductor laser according to claim 1, wherein said upper cladding layer and lower cladding layer each include $In_{1-x}(Ga_{1-y}Al_y)_xP$ where $1 \geq y > 0$, said active layer includes $In_{1-x}(Ga_{1-z}Al_z)_xP$ where $y \geq z$ and said high impurity concentration layer includes $In_{1-x}(Ga_{1-m}Al_m)_x(P_{1-n}As_n)$ where $1.0 \geq m \geq 0$, $1.0 \geq n \geq 0$.

7. A rib waveguide type semiconductor laser according to claim 1, wherein the impurity concentration of said high impurity concentration layer is not less than $5 \times 10^{18}$ cm$^{-3}$.

8. A rib waveguide type semiconductor laser according to claim 7, wherein the impurity contained in said high impurity concentration layer is selected from a group consisting of zinc and magnesium.

9. A rib waveguide type semiconductor laser according to claim 1, wherein said upper cladding layer and lower cladding layer each include p-$In_{0.49}(Ga_{0.3}Al_{0.7})_{0.51}P$, said active layer includes $In_{0.49}Ga_{0.51}P$ and said high impurity concentration layer includes p-In$_{0.49}$(Ga$_{0.8}$Al$_{0.2}$)$_{0.51}$P.

10. A rib waveguide type semiconductor laser according to claim 1, wherein said upper cladding layer and lower cladding layer each include p-In$_{0.49}$(Ga$_{0.3}$Al$_{0.7}$)$_{0.51}$P, said active layer includes In$_{0.49}$Ga$_{0.51}$P and said high impurity concentration layer includes p-Ga$_{0.6}$Al$_{0.4}$As.

11. A rib waveguide type semiconductor laser according to claim 1, wherein said upper cladding layer and lower cladding layer each include p-In$_{0.49}$(Ga$_{0.3}$Al$_{0.7}$)$_{0.51}$P, said active layer includes In$_{0.49}$Ga$_{0.51}$P and said high impurity concentration layer includes p-In$_{0.49}$(Ga$_{0.8}$Al$_{0.2}$)$_{0.51}$(P$_{0.95}$As$_{0.05}$).

* * * * *